(12) United States Patent
Kuo et al.

(10) Patent No.: US 7,323,879 B2
(45) Date of Patent: Jan. 29, 2008

(54) METHOD AND CIRCUIT FOR MEASURING CAPACITANCE AND CAPACITANCE MISMATCH

(75) Inventors: Shu-Hua Kuo, Hsinchu (TW); Jui-Ting Li, Taipei County (TW)

(73) Assignee: United Microelectronics Corp., Hsinchu (TW)

( * ) Notice: Subject to any disclaimer, the term of this patent is extended or adjusted under 35 U.S.C. 154(b) by 349 days.

(21) Appl. No.: 10/711,667

(22) Filed: Sep. 30, 2004

(65) Prior Publication Data

US 2006/0085714 A1    Apr. 20, 2006

(51) Int. Cl.
*G01R 31/08*    (2006.01)
*G01R 31/02*    (2006.01)

(52) U.S. Cl. .................... 324/519; 324/537

(58) Field of Classification Search ............... 324/519, 324/537
See application file for complete search history.

(56) References Cited

U.S. PATENT DOCUMENTS 5,602,487 A    2/1997   Manku

2004/0004488 A1 *   1/2004   Baxter ................ 324/678
2006/0214890 A1 *   9/2006   Morishige et al. ........ 345/77

FOREIGN PATENT DOCUMENTS

CN    1320900    11/2001

* cited by examiner

*Primary Examiner*—Anjan Deb
*Assistant Examiner*—Amy He
(74) *Attorney, Agent, or Firm*—Jianq Chyun IP Office

(57) ABSTRACT

A circuit and method for measuring capacitance and capacitance mismatch of at least one capacitor pair are provided. The circuit includes a first switch, a second switch, a third switch and a P-type transistor. A terminal of the first switch is connected to a terminal of a first capacitor, and a terminal of the second switch is connected to a terminal of a second capacitor. A terminal of the third switch is connected to another terminal of the first capacitor and another terminal of the second capacitor, and a gate of the P-type transistor is connected to another terminal of the third switch. When the first, second and third switches are turned on, a capacitance of the first capacitor, a capacitance of the second capacitor, or a capacitance mismatch between the first and second capacitances is measured.

12 Claims, 4 Drawing Sheets

METHOD AND CIRCUIT FOR MEASURING CAPACITANCE AND CAPACITANCE MISMATCH

BACKGROUND OF THE INVENTION

1. Field of the Invention

The present invention generally relates to a measurement method and circuit. More particularly, the present invention relates to a measurement method and circuit for measuring the capacitance and the capacitance mismatch of capacitor pairs.

2. Description of Related Art

Conventionally, in a semiconductor integrated circuit (IC), capacitor is an important component. In general, the statistic variation of the mismatch (or ratio) of the capacitances of capacitor pair is important for switched capacitor circuit techniques. Therefore, the measurement of the mismatch or the ratio of the capacitances of capacitor pair is highly desired.

In general, for a capacitor pair constructed by two capacitors, a conventional measurement method is provided by a capacitor matching method to measure the mismatch between the capacitances of two capacitors. FIG. 1 illustrates a conventional circuit for measuring a capacitance and a mismatch of the capacitances of two capacitors. Referring to FIG. 1, assume that a capacitor 102 to be measured has a capacitance C1 and another capacitor 104 to be measured has a capacitance C2. As shown in FIG. 1, PMOS transistor having a floating gate is used to measure the capacitance C1, C2 or the mismatch between the capacitance C1 and C2. The capacitance Cpar represents a parasitic capacitance between the gate and the drain of the PMOS transistor, and it will be proved that the mismatch between the capacitance C1 and C2 is not dependent on the parasitic capacitance Cpar. Referring to FIG. 1, a terminal of the capacitor 102 and a terminal of the 104 are connected to the floating gate of the PMOS transistor. The other terminal of the capacitor 102 is a voltage input terminal for inputting an input voltage Vin, and the other terminal of the capacitor 104 is connected to ground. The source of the PMOS transistor is connected to a current source 11, and the drain of the PMOS transistor is grounded.

The circuit of FIG. 1 may be provided to measure the capacitance C1 of the capacitor 102 when the capacitance C2 of the capacitor 104 is known. The measurement is adopted by applying at least two input voltages Vin_lo and Vin_hi from the voltage input terminal of the capacitor 104 and then to measure the output voltages Vout_lo and Vout_hi at the source of the PMOS transistor. Therefore, a slope S is obtained.

FIG. 2 illustrates a measurement result of the circuit shown in FIG. 1. Referring to FIG. 2, as described above, the slope S is:

$$S=(Vout\_hi-Vout\_lo)/(Vin\_hi-Vin\_lo)=C1/(C1+C2) \quad (1)$$

Therefore, when capacitance C2 is known or given, the capacitance C1 can be measured.

In addition, the circuit of FIG. 1 can also be provided to measure the mismatch between the capacitance C1 and C2 by using the method shown in FIG. 2. Assume that $\Delta C$ represents the difference between the capacitance C1 and C2, i.e., $\Delta C = C1 - C2$, and C represent the average value of capacitance C1 and C2, i.e., $C=(C1+C2)/2$. It is noted that, the ratio of $\Delta C$ to C is:

$$\Delta C/C = 2(C1-C2)/(C1+C2) = 4(S-1/2) \quad (2)$$

Therefore, the mismatch $\Delta C/C$ of the capacitance C1 and C2 is obtained by the slope S measured by the method shown in FIG. 2.

Moreover, when the parasitic capacitance Cpar shown in FIG. 1 cannot be ignored, the circuit of FIG. 1 can also be provided for measuring the ratio $\Delta C/C$. The measurement method includes the following steps. First, a first slope S1 is measured in the circuit shown in FIG. 1 by using the measurement method similar to FIG. 2, wherein S1 is:

$$S1=C1/(C1+C2+Cpar) \quad (3)$$

The Cpar represents the parasitic capacitance shown in FIG. 1. Thereafter, since the capacitors 102 and 104 are disposed symmetrically, referring to FIG. 3, the capacitor 102 is grounded and the voltage input terminal of the capacitor 104 is connect to an input voltage Vin. Thus, a second slope S2 is measured by using the measurement method similar to FIG. 2, wherein S2 is:

$$S2=C2/(C1+C2+Cpar) \quad (4)$$

Therefore, the ratio of $\Delta C$ to C is obtained by combining the equations (3) and (4):

$$\Delta C/C=2(C1-C2)/(C1+C2)=2(S1-S2)/(S1+S2) \quad (5)$$

Therefore, the ratio of $\Delta C$ to C is obtained by measuring the first slope S1 and the second slope S2 by using the measurement method similar to FIG. 2. It is noted that, the ratio $\Delta C/C$ is only dependent on the first slope S1 and the second slope S2, and is independent on the parasitic capacitance Cpar.

FIG. 4 illustrates a capacitor matching circuit of a conventional semiconductor integrated circuit (IC). Referring to FIG. 4, in general, when two capacitors 402a and 402b are measured, a PMOS transistor 406 and four pads 404a, 404b, 404c and 404d are required. Therefore, when a plurality of capacitor pairs are measured, it is noted that a lot of PMOS transistors and pads are required. The area required for the capacitor matching circuit is large since 4 pads are required for measuring each capacitor pair. Moreover, the pads connected and detected for the measurement are changed in each measurement. Thus, if the conventional capacitor matching circuit and method are provided for a semiconductor integrated circuit (IC), the measurement too complex to be enabled. Therefore, a measurement method and circuit suitable for measuring a plurality of capacitor pairs is quite desirable.

SUMMARY OF THE INVENTION

Therefore, the present invention is directed to a method of measuring the capacitance and the capacitance mismatch of at least one capacitor pair.

In addition, the present invention is directed to a circuit for measuring the capacitance and the capacitance mismatch of at least one capacitor pair.

The present invention provides a measurement method comprising, for example but not limited to, the following steps. First of all, a first switch is provided, wherein a terminal of the first switch is connected to a terminal of a first capacitor. Then, a second switch is provided, wherein a terminal of the second switch is connected to a terminal of a second capacitor. Next, a third switch is provided, wherein a terminal of the third switch is connected to another terminal of the first capacitor and another terminal of the second capacitor. Then, a P-type transistor is provided, wherein a gate of the P-type transistor is connected to another terminal of the third switch. When the first switch, the second switch and the third switch are turned on, a capacitance of the first capacitor, a capacitance of the second capacitor, or a ratio of a difference between the capacitance of first capacitor and the capacitance of the second capacitor to an average of the capacitance of first capacitor and the capacitance of the second capacitor is measured via the another terminal of the first switch, the another terminal of the second switch, and a source and a drain of the P-type transistor.

Furthermore, the present invention provides a circuit comprising, for example but not limited to, a first switch, a second switch, a third switch and a P-type transistor. A terminal of the first switch is connected to a terminal of a first capacitor, and a terminal of the second switch is connected to a terminal of a second capacitor. A terminal of the third switch is connected to another terminal of the first capacitor and another terminal of the second capacitor, and a gate of the P-type transistor is connected to another terminal of the third switch. When the first switch, the second switch and the third switch are turned on, a capacitance of the first capacitor, a capacitance of the second capacitor, or a ratio of a difference between the capacitance of first capacitor and the capacitance of the second capacitor to an average of the capacitance of first capacitor and the capacitance of the second capacitor is measured via the another terminal of the first switch, the another terminal of the second switch, and a source and a drain of the P-type transistor.

Moreover, the present invention provides a method of measuring a mismatch of capacitances and respective capacitances of a plurality of capacitor pairs, wherein each capacitor pair comprises at least a first capacitor and a second capacitor. The method comprises for example but not limited to, the following steps. First of all, a first switch is connected to each of the capacitor pair respectively. A terminal of each of the first switch is connected to a terminal of the first capacitor of the corresponding capacitor pair, and another terminal of each of the first switch is connected to a first pad respectively. Then, a second switch is connected to each of the capacitor pair respectively. A terminal of each of the second switch is connected to a terminal of the second capacitor of the corresponding capacitor pair, and another terminal of each of the second switch is connected to a second pad respectively. Next, a third switch is connected to each of the capacitor pair respectively, wherein a terminal of each of the third switch is connected to another terminal of the first capacitor and another terminal of the second capacitor of the corresponding capacitor pair. Then, a P-type transistor is provided, wherein a gate of the P-type transistor is connected to another terminal of the third switch of all of the capacitor pairs. Therefore, a capacitance of one of the first capacitors, a capacitance of one of the second capacitors, or a ratio of a difference between the capacitance of the one of the first capacitors and the capacitance of the one of the second capacitors to an average of the capacitance of the one of the first capacitors and the capacitance of the one of the second capacitors is measured via the first pad, the second pad, and a source and a drain of the P-type transistor.

In one embodiment of the present invention, when the first switch, the second switch and the third switch of one of the capacitor pair are turned on, for the one of the capacitor pair, the capacitance of the first capacitor thereof, the capacitance of the second capacitor thereof, or a ratio of a difference between the capacitance of the first capacitor and the capacitance of the second capacitor to an average of the capacitance of the first capacitor and the capacitance of the second capacitor thereof is measured.

In one embodiment of the present invention, when the first switch and the third switch of one of the capacitor pair, and the second switch and the third switch of another one of the capacitor pair are turned on, the capacitance of the first capacitor of the one of the capacitor pair, the capacitance of the second capacitor of the another one of the capacitor pair, or a ratio of a difference between the capacitance of the first capacitor of the one of the capacitor pair and the capacitance of the second capacitor of the another one of the capacitor pair to an average of the capacitance of the first capacitor of the one of the capacitor pair and the capacitance of the second capacitor of the another one of the capacitor pair is measured.

In one embodiment of the present invention, the method further comprises the step of providing a selection circuit, connect to all of the first switches, the second switches and the third switches to selectively turn on or turn off the first switches, the second switches or the third switches. Thus, it is possible to automatically perform the method via the selection circuit. In another embodiment of the invention, the selection circuit comprises a shift register.

In addition, the present invention provides a circuit for measuring capacitance and differential capacitance of a plurality of capacitor pairs, wherein each capacitor pair comprises at least a first capacitor and a second capacitor. The circuit comprises a plurality of first switches, a plurality of second switches, a plurality of third switches and a P-type transistor. A terminal of each of the first switch is connected to a terminal of the first capacitor of each of the capacitor pairs, and another terminal of all of the first switch is connected to a first pad. A terminal of each of the second switch is connected to a terminal of the second capacitor of each of the capacitor pairs, and another terminal of all of second switches is connected to a second pad. A terminal of each of third switches is connected to another terminal of the first capacitor and another terminal of the second capacitor of each of capacitor pairs. A gate of the P-type transistor is connected to another terminal of the third switch of all of capacitor pairs. Thus, a capacitance of one of first capacitors, a capacitance of one of second capacitors, or a ratio of a difference between the capacitance of the one of the first capacitors and the capacitance of the one of the second capacitors to an average of the capacitance of the one of the first capacitors and the capacitance of the one of the second capacitors is measured via the first pad, the second pad, and a source and a drain of the P-type transistor.

In one embodiment of the present invention, when the first switch, the second switch and the third switch of one of capacitor pairs are turned on, for the one of the capacitor pair, the capacitance of the first capacitor thereof, the capacitance of the second capacitor thereof, or a ratio of a difference between the capacitance of the first capacitor and the capacitance of the second capacitor to an average of the capacitance of the first capacitor and the capacitance of the second capacitor thereof is measured.

In one embodiment of the present invention, when the first switch and the third switch of one of capacitor pairs, and the second switch and the third switch of another one of capacitor pairs are turned on, the capacitance of the first capacitor of the one of capacitor pairs, the capacitance of the second capacitor of the another one of capacitor pairs, or a ratio of a difference between the capacitance of the first capacitor of the one of the capacitor pair and the capacitance of the second capacitor of the another one of the capacitor pair to an average of the capacitance of the first capacitor of the one of the capacitor pair and the capacitance of the second capacitor of the another one of the capacitor pair is measured.

In one embodiment of the present invention, the circuit further comprises a selection circuit connected to all of the first switches, the second switches and the third switches to selectively turn on or turn off the first switches, the second switches or the third switches. Therefore, it is possible to automatically operate the circuit via the selection circuit. In one embodiment of the invention, the selection circuit comprises a shift register.

Accordingly, in the present invention, the first switches, the second switches and the third switches are provided for selecting the first capacitor and the second capacitor to be measured, wherein the precision of the measurement result is not influenced by all the switches. In addition, in the present invention, only four pads and one P-type transistor is sufficient, thus the area of the layout of the circuit is effectively reduced. In addition, when a selection circuit such as a shift register is provided, the measurement can be programmed and can be automatic, and thus the efficiency of the measurement is enhanced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 5:
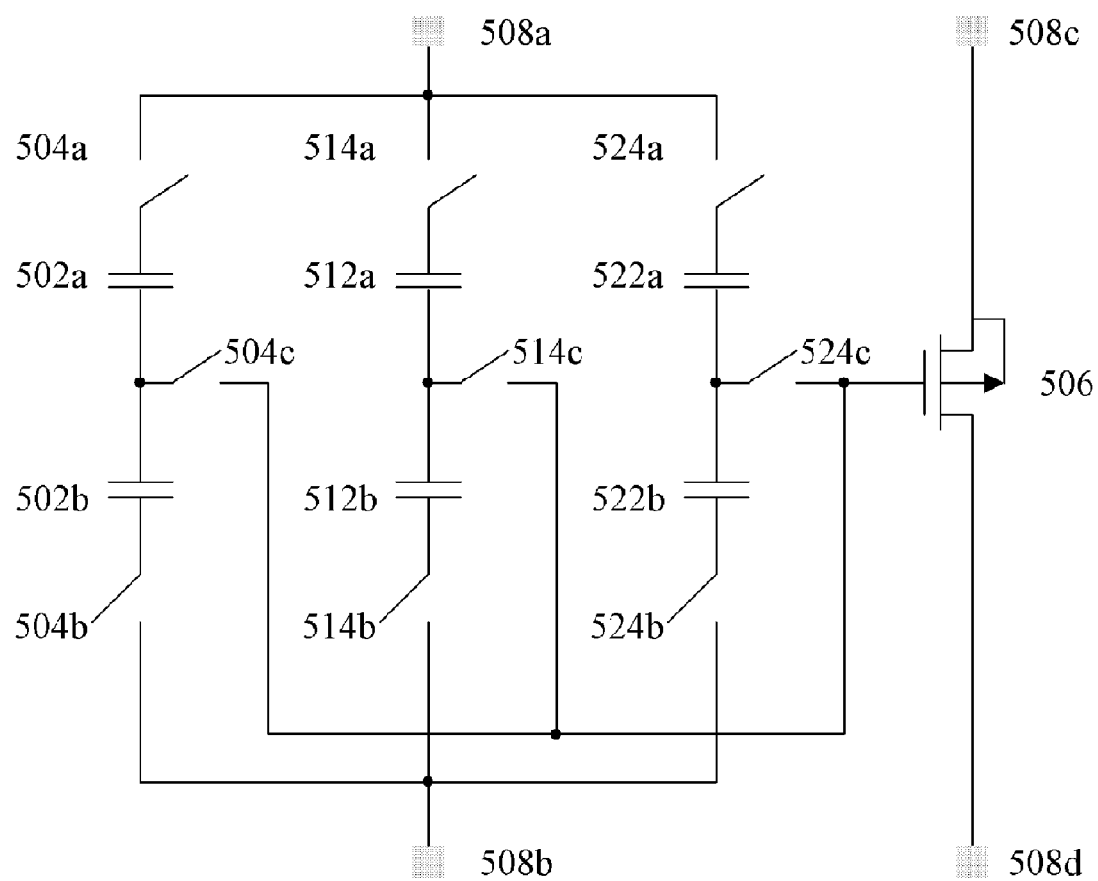
FIG. 5 illustrates a circuit for measuring a mismatch of capacitances and respective capacitances of two capacitors according to one embodiment of the present invention.

FIG. 5 illustrates a circuit for measuring a capacitance and a differential capacitance of two capacitors according to one embodiment of the present invention. It is noted that FIG. 5 illustrates three capacitor pairs, however, the scope of present invention is not limited to the drawings and the embodiments of the invention. Referring to FIG. 5, a circuit for measuring at least two capacitor pairs comprises, for example but not limited to, a first, a second and a third capacitor pairs. The first capacitor pair comprises a first capacitor 502a and a second capacitor 502b, the second capacitor pair comprises a first capacitor 512a and a second capacitor 512b, and the third capacitor pair comprises a first capacitor 522a and a second capacitor 522b. It is noted that in the invention, each capacitor pair may comprise more than two capacitors. A terminal of the first switches 504a, 514a and 524a is connected to the corresponding first capacitors 502a, 512a and 522a respectively, and another terminal of each of the first switches is connected to a first pad 508a. In addition, a terminal of the second switches 504b, 514b and 524b is connected to the corresponding second capacitors 502b, 512b and 522b respectively, and another terminal of each of the second switches is connected to a second pad 508b. Moreover, a terminal of the third switches 504c, 514c and 524c is connected to the corresponding first capacitors 502a, 512a and 522a and the second capacitors 502b, 512b and 522b respectively. In addition, in the present invention, only one P-type transistor 506 is provided, wherein a gate of the P-type transistor 506 is connected to another terminal of the third switches 504c, 514c and 524c. The drain and source are connected to a third pad 508c and a fourth pad 508d respectively.

Figure 1:
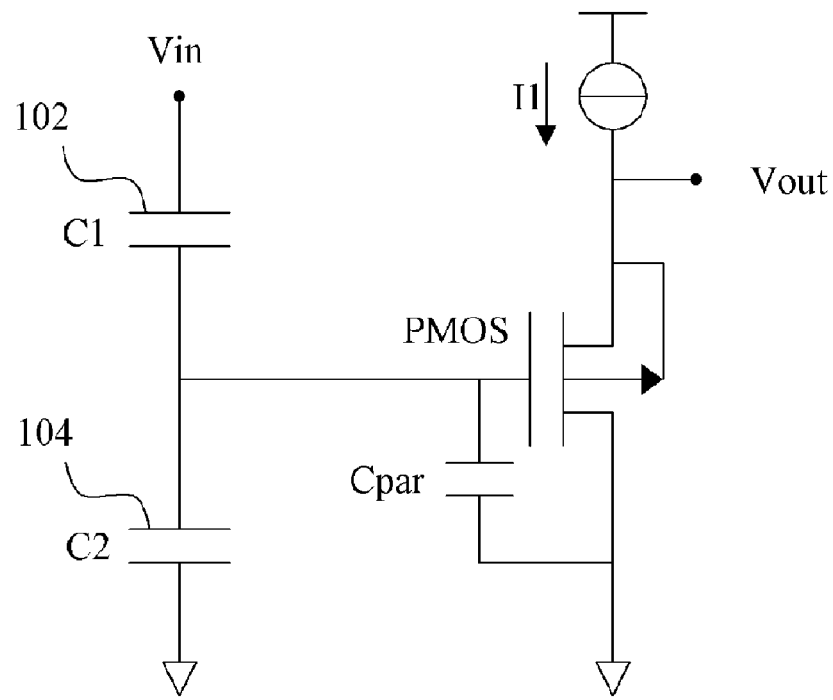
FIG. 1 illustrates a conventional circuit for measuring a capacitance and a differential capacitance of two capacitors.
Figure 2:
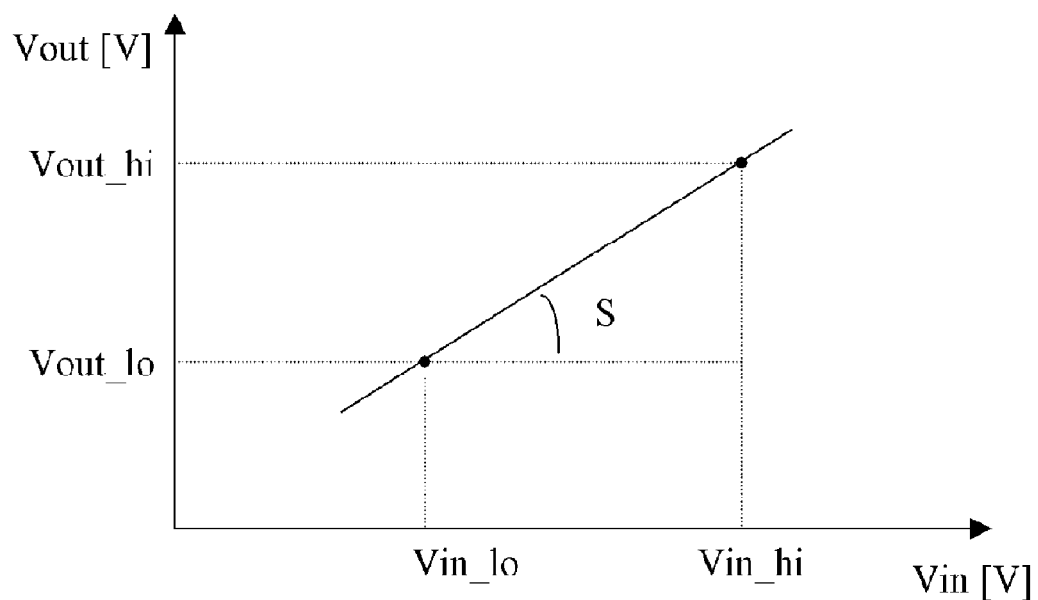
FIG. 2 illustrates a measurement result of the circuit shown in FIG. 1.
Figure 3:
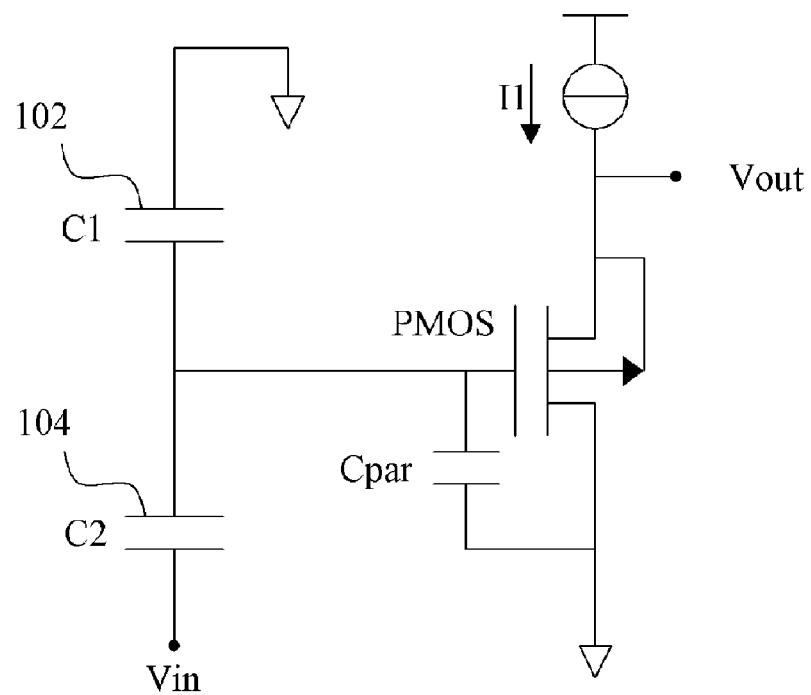
FIG. 3 illustrates a conventional circuit for measuring a capacitance and a differential capacitance of two capacitors.
Figure 4:
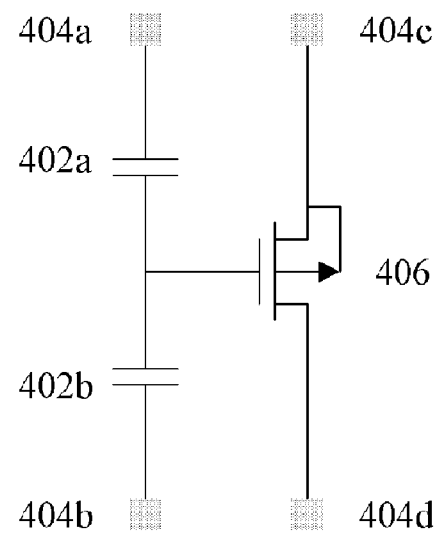
FIG. 4 illustrates a capacitor matching circuit of a conventional semiconductor integrated circuit (IC).

In one embodiment of the present invention, for example, for the first capacitor 502a and the second capacitor 502b of the same capacitor pair, when the first switch 504a, the second switch 504b and the third switch 504c are all turned on, the following measurement can be performed. It is noted that in the present invention, the third switch 524c are turned on. First, when the capacitance of the second capacitor 502b is known or given, the capacitance of the first capacitor 502a can be measured by equation (1) and the method shown in FIG. 2 described above. Next, when the capacitance of the first capacitor 502a is known or given, the capacitance of the second capacitor 502b can be measured by equation (1) and the method shown in FIG. 2 described above. Next, the mismatch $\Delta C/C$ of the first capacitor 502a and the capacitance of the second capacitor 502b can be measured. When the parasitic capacitance of the circuit is negligible, the first measurement method may be performed by the circuit shown in FIG. 1. In other words, the second capacitor 502b is grounded and a plurality of input voltages are applied to the first capacitor 502a, thus the ratio $\Delta C/C$ is measured by equations (1) and (2) and the method shown in FIG. 2. The second measurement method may be performed as the circuit shown in FIG. 3. In other words, the first capacitor 502a is grounded and a plurality of input voltages are applied to the second capacitor 502b, thus the ratio $\Delta C/C$ is measured by equations (1) and (2) and the method shown in FIG. 2. It is noted that in the embodiment, $S=C2/(C1+C2)$. When the parasitic capacitance of the circuit is not negligible, the third measurement method is performed by using the first measurement method referring to FIG. 1 and the second measurement method referring to FIG. 3. By using equation (5) and the method shown in FIG. 2, the ratio $\Delta C/C$ is obtained. It is noted that, since the third measurement method is independent of the parasitic capacitance of the circuit shown in FIG. 5, the measured ratio $\Delta C/C$ is more precise than that of the first and the second measurement methods.

Referring to FIG. 5, in another embodiment of the present invention, for example, for the first capacitor 512a and the second capacitor 522b of different capacitor pairs, when the first switch 514a, the third switch 514c, the second switch 524b and the third switch 524c are all turned on, the following measurement can be performed. It is noted that in the present invention, the third switch 524c are turned on. First, when the capacitance of the second capacitor 522b is known or given, the capacitance of the first capacitor 512a can be measured by equation (1) and the method shown in FIG. 2 described above. Next, when the capacitance of the first capacitor 512a is known or given, the capacitance of the second capacitor 522b can be measured by equation (1) and the method shown in FIG. 2 described above. Next, the mismatch ΔC/C of the first capacitor 512a and the capacitance of the second capacitor 522b can be measured. When the parasitic capacitance of the circuit is negligible, the first measurement method may be performed by the circuit shown in FIG. 1. In other words, the second capacitor 522b is grounded and a plurality of input voltages are applied to the first capacitor 512a, thus the ratio ΔC/C is measured by equations (1) and (2) and the method shown in FIG. 2. The second measurement method may be performed as the circuit shown in FIG. 3. In other words, the first capacitor 512a is grounded and a plurality of input voltages are applied to the second capacitor 522b, thus the ratio ΔC/C is measured by equations (1) and (2) and the method shown in FIG. 2. It is noted that in the embodiment, S=C2/(C1+C2). When the parasitic capacitance of the circuit is not negligible, the third measurement method is performed by using the first measurement method referring to FIG. 1 and the second measurement method referring to FIG. 3. By using equation (5) and the method shown in FIG. 2, the ratio ΔC/C is obtained. It is noted that, since the third measurement method is not dependent on the parasitic capacitance of the circuit shown in FIG. 5, the measured ratio ΔC/C is more precise than that of the first and the second measurement methods.

Figure 6:
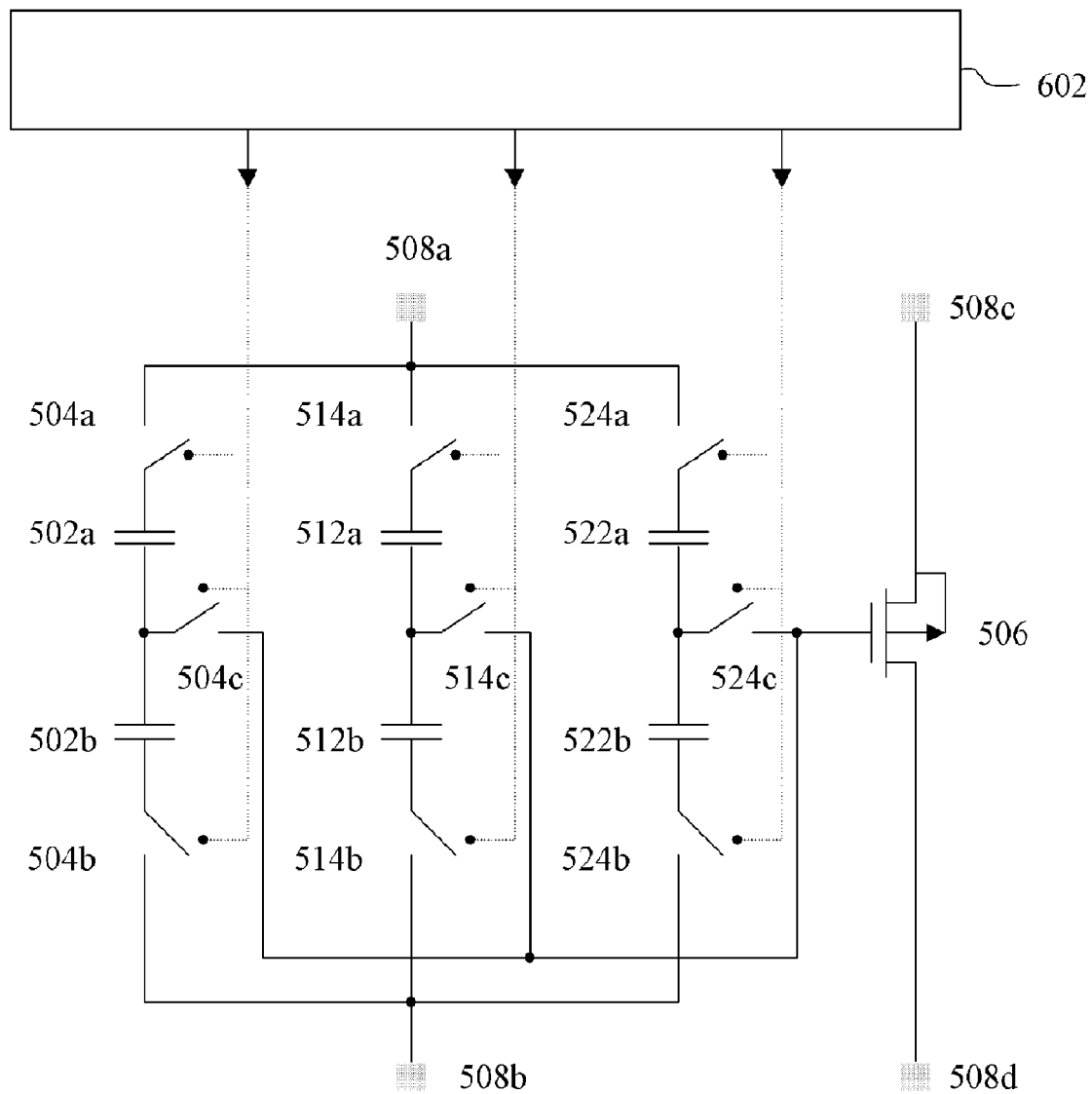
FIG. 6 illustrates a circuit for measuring a mismatch of capacitances and respective capacitances of a plurality of capacitors according to one embodiment of the present invention.

FIG. 6 illustrates a circuit for measuring a capacitance and a mismatch of the capacitance of a plurality of capacitors according to one embodiment of the present invention. In comparison with FIG. 6 and FIG. 5, it is noted that a shift register 602 is provided in FIG. 6, wherein the shift register 602 is connected to the first switch, the second switch and the third switch of each capacitor pair sequentially. Therefore, the shift register 602 can be provided to select and measure the capacitance of the first capacitor, the capacitance of the second capacitor or the ratio ΔC/C of each capacitor pair sequentially. In one embodiment of the invention, the shift register 602 may be, for example but not limited to, programmed for automatically performing the measurement described above.

It is noted that, in the embodiments of the present invention described above, a plurality of first switches, second switches and third switches are provided for selecting the first capacitor and the second capacitor to be measured. Since the first switches, the second switches and the third switches do not accumulate or store charges, the precision of the measurement described above is not influenced.

Therefore, in the present invention, regardless of the number of the capacitor pairs of the semiconductor integrated circuit (IC) 702, only a P-type transistor and four pads 704 are sufficient for performing the measurement described above.

Accordingly, in the present invention, the first switches, the second switches and the third switches are provided for selecting the first capacitor and the second capacitor to be measured, wherein the precision of the measurement is not influenced by all the switches. In addition, in the present invention, only four pads and one P-type transistor is sufficient, thus the area of the layout of the circuit is effectively reduced. In addition, when a selection circuit such as a shift register is provided, the measurement can be programmed and can be automatic, and thus the efficiency of the measurement is enhanced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of measuring at least two capacitor pairs, wherein each of the capacitor pairs comprises at least a first capacitor and a second capacitor, the method comprising:

providing a first switch to each capacitor pair respectively, each first switch having a first terminal and a second terminal, wherein the first terminal of each first switch is connected to a terminal of the first capacitor of the corresponding capacitor pair, and the second terminal of each first switch is connected to a first pad respectively;

providing a second switch to each capacitor pair respectively, each second switch having a first terminal and a second terminal, wherein the first terminal of each second switch is connected to a terminal of the second capacitor of the corresponding capacitor pair, and the second terminal of each second switch is connected to a second pad respectively;

providing a third switch to each capacitor pair respectively, each third switch having a first terminal and a second terminal, wherein the first terminal of each third switch is connected to another terminal of the first capacitor and another terminal of the second capacitor of the corresponding capacitor pair; and providing a P-type transistor, the P-type transistor having a gate, a drain and source, wherein the gate of the P-type transistor is connected to the second terminal of each third switch the drain of the P-type transistor is connected to a third pad, and the source of the P-type transistor is connected to a fourth pad;

wherein a capacitance of one of the first capacitors, a capacitance of one of the second capacitors, or a ratio of a difference between the capacitance of the one of the first capacitors and the capacitance of the one of the second capacitors to an average of the capacitance of the one of the first capacitors and the capacitance of the one of the second capacitors is measured via the first pad, the second pad, the third pad and the fourth pad.

2. The method of claim 1, wherein when the first switch, the second switch and the third switch of one of the capacitor pairs are turned on, for the one of the capacitor pairs, the capacitance of the first capacitor thereof, the capacitance of the second capacitor thereof or a ratio of a difference between the capacitance of the first capacitor and the capacitance of the second capacitor to an average of the capacitance of the first capacitor and the capacitance of the second capacitor thereof is measured via the first pad, the second pad, the third pad and the fourth pad.

3. The method of claim 1, wherein when the first switch and the third switch of one of the capacitor pairs, and die second switch and the third switch of another one of the capacitor pairs are turned on, the capacitance of the first capacitor of the one of the capacitor pairs, the capacitance of the second capacitor of the another one of the capacitor pairs, or a ratio of a difference between the capacitance of the first capacitor of the one of the capacitor pairs and the capacitance of the second capacitor of the another one of the capacitor pairs to an average of the capacitance of the first capacitor of the one of the capacitor pairs and the capacitance of the second capacitor of the another one of the capacitor pairs is measured via the first pad, the second pad, the third pad and fourth pad.

4. The method of claim 1, further comprising:
providing a selection circuit, connected to all of the first switches, the second switches and the third switches to selectively turn on or turn off the first switches, the second switches or the third switches.

5. The method of claim 4, further comprising a step of automatically operating the method via the selection circuit.

6. The method of claim 4, wherein the selection circuit comprises a shift register.

7. A circuit for measuring at least two capacitor pairs, wherein each of the capacitor pairs comprises at least a first capacitor and a second capacitor, the circuit comprising:
a plurality of first switches, each first switch having a first terminal and a second terminal, wherein the first terminal of each first switch is connected to a terminal of the first capacitor of each of the capacitor pairs, and the second terminal of each first switch is connected to a first pad;
a plurality of second switches, each second switch having a first terminal and a second terminal, wherein the first terminal of each second switch is connected to a terminal of the second capacitor of each of the capacitor pairs, and the second terminal of each second switch is connected to a second pad;
a plurality of third switches, each third switch having a first terminal and a second terminal, wherein the first terminal of each third switch is connected to another terminal of the first capacitor and another terminal of the second capacitor of each of the capacitor pairs; and
a P-type transistor, having a gate, a drain and source, wherein the gate of the P-type transistor is connected to the second terminal of each third switch, the drain of the P-type transistor is connected to a third pad, and the source of the P-type transistor is connected to a fourth pad;

wherein a capacitance of one of the first capacitors, a capacitance of one of the second capacitors, or a ratio of a difference between the capacitance of the one of the first capacitors and the capacitance of the one of the second capacitors to an average of the capacitance of the one of the first capacitors and the capacitance of the one of the second capacitors is measured via the first pad, the second pad, the third pad, and the fourth pad.

8. The circuit of claim 7, wherein when the first switch, the second switch and the third switch of one of the capacitor pairs are turned on, for the one of the capacitor pairs, the capacitance of the first capacitor thereof, the capacitance of the second capacitor thereof, or a ratio of a difference between the capacitance of the first capacitor and the capacitance of the second capacitor to an average of the capacitance of the first capacitor and the capacitance of the second capacitor thereof is measured.

9. The circuit of claim 7, wherein when the first switch and the third switch of one of the capacitor pairs, and the second switch and the third switch of another one of the capacitor pairs are tuned on, the capacitance of the first capacitor of the one of the capacitor pairs, the capacitance of the second capacitor of the another one of the capacitor pairs, or a ratio of a difference between the capacitance of the first capacitor of the one of the capacitor pairs and the capacitance of the second capacitor of the another one of the capacitor pairs to an average of the capacitance of the first capacitor of the one of the capacitor pairs and the capacitance of the second capacitor of the another one of the capacitor pairs is measured via the first pad, the second pad, the third pad and the fourth pad.

10. The circuit of claim 7, further comprising:
a selection circuit, connected to all of the first switches, the second switches and the third switch to selectively turn on or turn off the first switches, the second switches or the third switches.

11. The circuit of claim 10, further comprising a step of automatically operating the circuit via the selection circuit.

12. The circuit of claim 10, the selection circuit comprises a shift register.

* * * * *